United States Patent
Coolbaugh et al.

(10) Patent No.: US 6,878,976 B2
(45) Date of Patent: Apr. 12, 2005

(54) CARBON-MODULATED BREAKDOWN VOLTAGE SIGE TRANSISTOR FOR LOW VOLTAGE TRIGGER ESD APPLICATIONS

(75) Inventors: Douglas D. Coolbaugh, Essex Junction, VT (US); Steven H. Voldman, South Burlington, VT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 10/063,025

(22) Filed: Mar. 13, 2002

(65) Prior Publication Data

US 2003/0173580 A1 Sep. 18, 2003

(51) Int. Cl.⁷ .............................. H01L 31/072
(52) U.S. Cl. ............... 257/183; 257/183; 257/200; 257/197; 257/198; 257/76; 257/542; 257/552; 257/565; 257/77; 257/96; 257/232; 438/312; 438/235; 438/309; 438/153
(58) Field of Search ................. 257/200, 198, 257/76, 565, 96, 232, 347, 192, 183, 197, 77, 552, 542; 438/312, 235, 309, 153

(56) References Cited

U.S. PATENT DOCUMENTS

| | | | |
|---|---|---|---|
| 5,286,997 A | * 2/1994 | Hill | 257/586 |
| 5,834,800 A | * 11/1998 | Jalali-Farahani et al. | 257/198 |
| 5,872,378 A | 2/1999 | Rose et al. | 257/355 |
| 6,118,171 A | 9/2000 | Davis et al. | 257/586 |
| 6,157,530 A | 12/2000 | Pequignot et al. | 361/111 |
| 6,221,713 B1 | 4/2001 | Huang | 438/241 |
| 6,222,250 B1 | 4/2001 | Gomi et al. | 257/574 |
| 6,225,181 B1 | 5/2001 | Gregory | 438/355 |
| 6,238,971 B1 | 5/2001 | Parekh et al. | 438/255 |
| 6,251,738 B1 | 6/2001 | Huang | 438/312 |
| 6,429,489 B1 | * 8/2002 | Botula et al. | 257/355 |
| 6,482,710 B2 | * 11/2002 | Oda et al. | 438/311 |
| 6,509,587 B2 | * 1/2003 | Sugiyama et al. | 257/192 |
| 2003/0082882 A1 | * 5/2003 | Babcock et al. | 438/309 |

OTHER PUBLICATIONS

Osten et al., Effect of carbon on boron diffusion in SiGe: Principles and impact on bipolar devices, J. Vac. Sci. tech. B, vol. 16, No. 3 P, 1750(1998).*

* cited by examiner

Primary Examiner—Eddie Lee
Assistant Examiner—Junghwa Im
(74) Attorney, Agent, or Firm—Connolly, Bove, Lodge & Hutz, LLP; Richard A. Henkler (57) ABSTRACT

Selectively implanting carbon in a transistor lowers the collector-to-emitter breakdown ($BV_{CEO}$) of the transistor. This transistor, with the lowered $BV_{CEO}$, is then used as a "trigger" device in an Electrostatic Discharge (ESD) power clamp comprising a first low breakdown trigger device and a second high breakdown clamp device. ESD power clamps are constructed using epitaxial base pseudomorphic Silicon Germanium heterojunction transistors in a common-collector Darlington configuration.

1 Claim, 7 Drawing Sheets

CARBON-MODULATED BREAKDOWN VOLTAGE SIGE TRANSISTOR FOR LOW VOLTAGE TRIGGER ESD APPLICATIONS

BACKGROUND OF THE INVENTION

1. Field of the Invention

The present invention relates to transistor design, and, in particular, a transistor with carbon inplants used to vary the collector-to-emitter breakdown voltage. ($BV_{CEO}$).

2. Background of the Invention

Electrostatic discharge (ESD) protection of radio frequency (RF) products is important as application frequencies exceed 1 GHz. Below 1 GHz application frequency, the ability to simultaneously achieve excellent ESD protection and performance objectives was possible in most CMOS, BiCMOS, and SOI applications. As semiconductor applications extend beyond 1 GHz applications from 10 to 100 GHz, providing ESD protection and satisfying performance goals will increase in difficulty. Today, high speed data rate wired, wireless, test equipment and disk drive applications are extending well above 1 GHz. Today, Silicon Germanium (SiGe) technology produces heterojunction bipolar transistors that show significant increases in unity current gain cutoff frequency ($f_T$) every technology generation. As shown by the discussion that follows regarding the Johnson Limit, a transistor's $BV_{CEO}$ is a function of that transistor's unity current gain cutoff frequency.

With transistors whose unity current gain cutoff frequency $f_T$ exceed 10 GHz, the ability to provide ESD protection without impacting performance will be a significant challenge. For RF applications, ESD elements must have low capacitance, a high quality factor (Q), linearity and low noise. These criteria can not be satisfied by many of today's ESD solutions (e.g., silicon controlled rectifiers (SCR), and MOSFET transistors) leaving diode and diode configuration elements as a key choice for RF applications.

ESD Power Clamps between power rails are important for RF products because RF applications and BiCMOS chips can be small chips (e.g. low chip capacitance) and the need to scale the size of ESD structure small to reduce loading effects at the pin. Hence, using RF diode-based solutions, the current must flow through the chip power grid back to the ground plane. As a result, low impedance ESD power grids with low and/or scalable trigger solutions are needed for RF semiconductor chips. To provide an ESD solution that naturally scales with the BiCMOS technology, and utilizes the limitation of bipolar transistors, ESD power clamps were designed which take advantage of the Johnson Limit of SiGe HBT devices.

Relation Between Unitary Gain Cutoff Frequency and $BV_{CEO}$:

A fundamental relationship exists between the frequency response of the transistor and maximum power applied across the transistor element known as the Johnson Limit. The Johnson Limit in its power formulation is given as $$(P_m X_c)^{1/2} f_T = E_m v_s / 2\pi$$

where Pm is the maximum power, $X_C$ is the reactance $X_c = ½ \pi f_T C_{bc}$, $f_T$ is the unity current gain cutoff frequency, $E_m$ is the maximum electric field, and $v_s$ is the electron saturation velocity. In this form, the formulation states that there is an inverse relationship between the maximum power and frequency response This can also be expressed in terms of maximum voltage, $V_m$ $$V_m f_T = E_m v_s / 2\pi$$

This formulation states that the product of the maximum velocity an electron can traverse a medium and the maximum electric field across that region is a constant. It also states that there is an inverse relationship between the transistor speed and the allowed breakdown voltage. Graphically, this is shown as follows:

Based on the Johnson Limit condition, as BiCMOS SiGe technologies scale to provide a higher unity current gain cutoff frequency $f_T$, the $BV_{CEO}$ of the transistor decreases. Hence from the Johnson Limit equation, $$V^*_m f^*_T = V_m f_T = E_m v_s / 2\pi$$

where $V^*_m f^*_T$ is associated with a first transistor and $V_m f_T$ is associated with a second transistor. The ratio of breakdown voltages can be determined as $$\frac{V^*_m}{V_m} = \frac{f_T}{f^*_T} \qquad [t5]$$

Using this Johnson relationship, an ESD power clamp can be synthesized where a trigger device with the lowest breakdown voltage can be created by using the highest cutoff frequency ($f_T$) transistor and a clamp device with the highest breakdown device will have the lowest cutoff frequency ($f_T$).

However, it is possible to further lower the breakdown voltage of the trigger transistor by introducing carbon into the structure of the transistor.

BRIEF SUMMARY OF THE INVENTION

The present invention relates to providing carbon in the structure of an SiGe transistor to modulate the redistribution of dopants in the base-collector region of the transistor, thus lowering the $BV_{CEO}$ of the transistor. Carbon atoms placed in the base region of a SiGe transistor influence the transient enhanced diffusion (TED) of dopants in the silicon lattice in the vicinity of the base-collector region. In the base-collector region, the base region contains boron, germanium and silicon atoms. In the collector region, the dopants can be arsenic, phosphorus, and antimony, or other n-type dopants. Placing carbon in the region below the base-collector junction region causes the dopants to diffuse either toward or away from the junction area, thereby changing the $BV_{CEO}$ of the transistor. The $BV_{CEO}$ of the transistor can be further decreased by increasing the collector's doping concentration.

A transistor with a lowered $BV_{CEO}$ can be used as the trigger portion of a trigger-clamp ESD protection circuit.

DETAILED DESCRIPTION OF THE INVENTION

Figure 1:
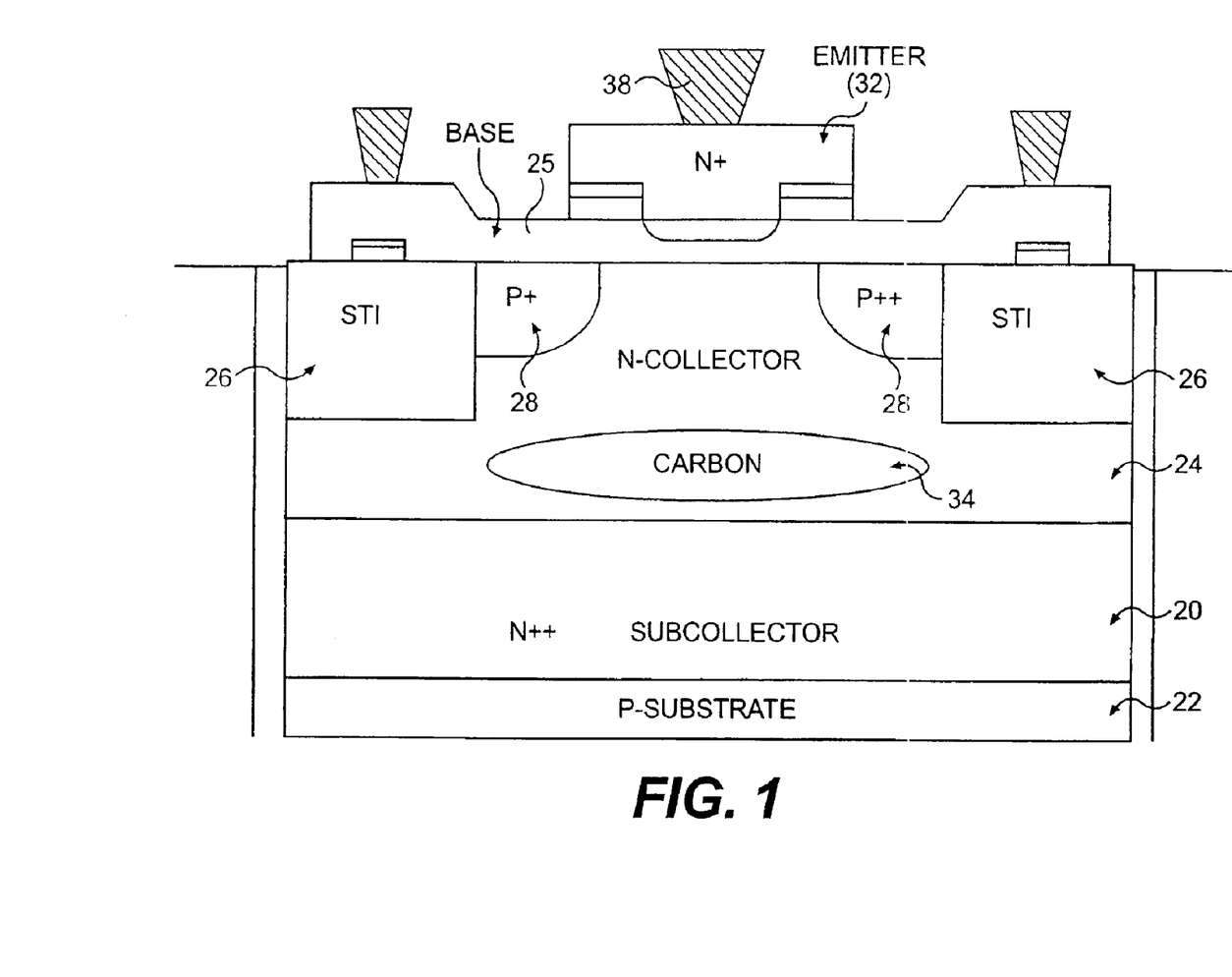
FIG. 1 shows a transistor of one embodiment of the present invention, with carbon implanted in the collector of the transistor.

FIG. 1 shows the SiGe HBT structure for a transistor to be used in a trigger-clamp ESD protection circuit. The SiGe HBT devices are designed on a p− substrate (22). A n++ subcollector (20) is then formed over the p− substrate (22). An n− collector (24) is then formed over the n++ subcollector. The n− dopants in the n− collector (24) can be arsenic, phosphorus, and antimony, or any other type n− dopant. Shallow trench isolation areas (26) are then formed in the n− collector. The base (25) is formed by providing a ultra-high vacuum chemical vapor deposition (UHV/CVD) SiGe deposited film on the silicon surface. The extrinsic base is then formed by forming p+ (28) areas adjacent to the n− collector. An emitter (32) is then formed to overlap the p+ (28) extrinsic base areas and the n− collector (24).

Figure 2:
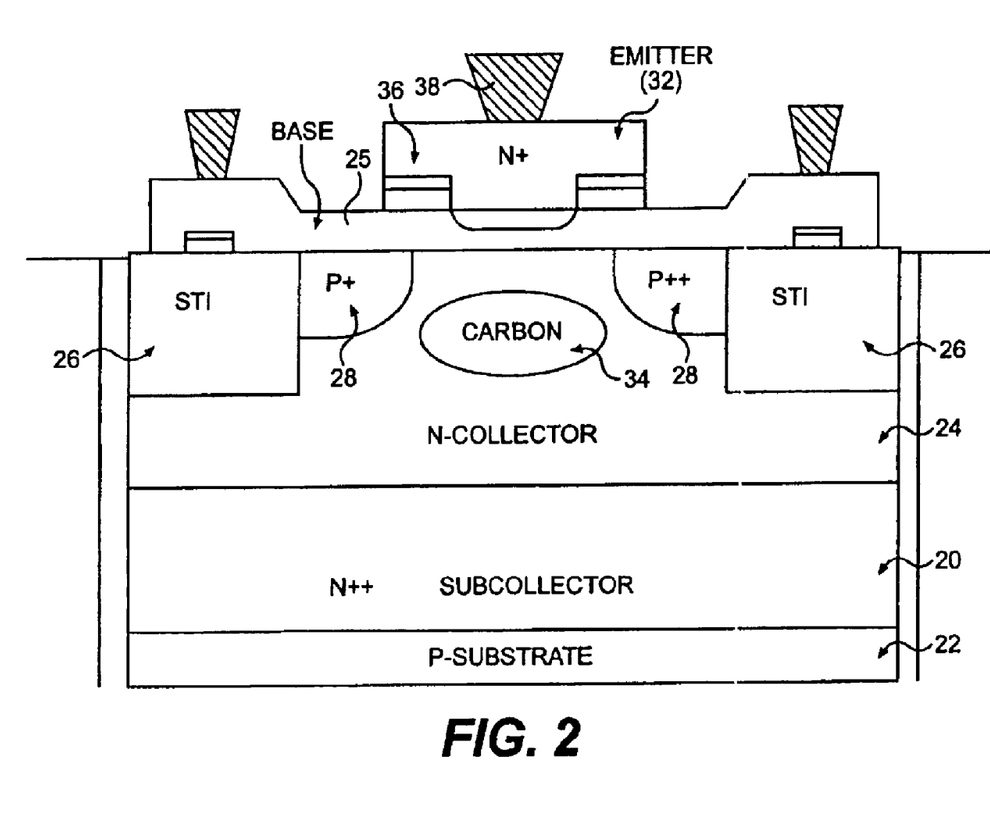
FIG. 2 shows a transistor of another embodiment of the present invention, with carbon implanted in the collector in close proximity to the extrinsic base.
Figure 3:
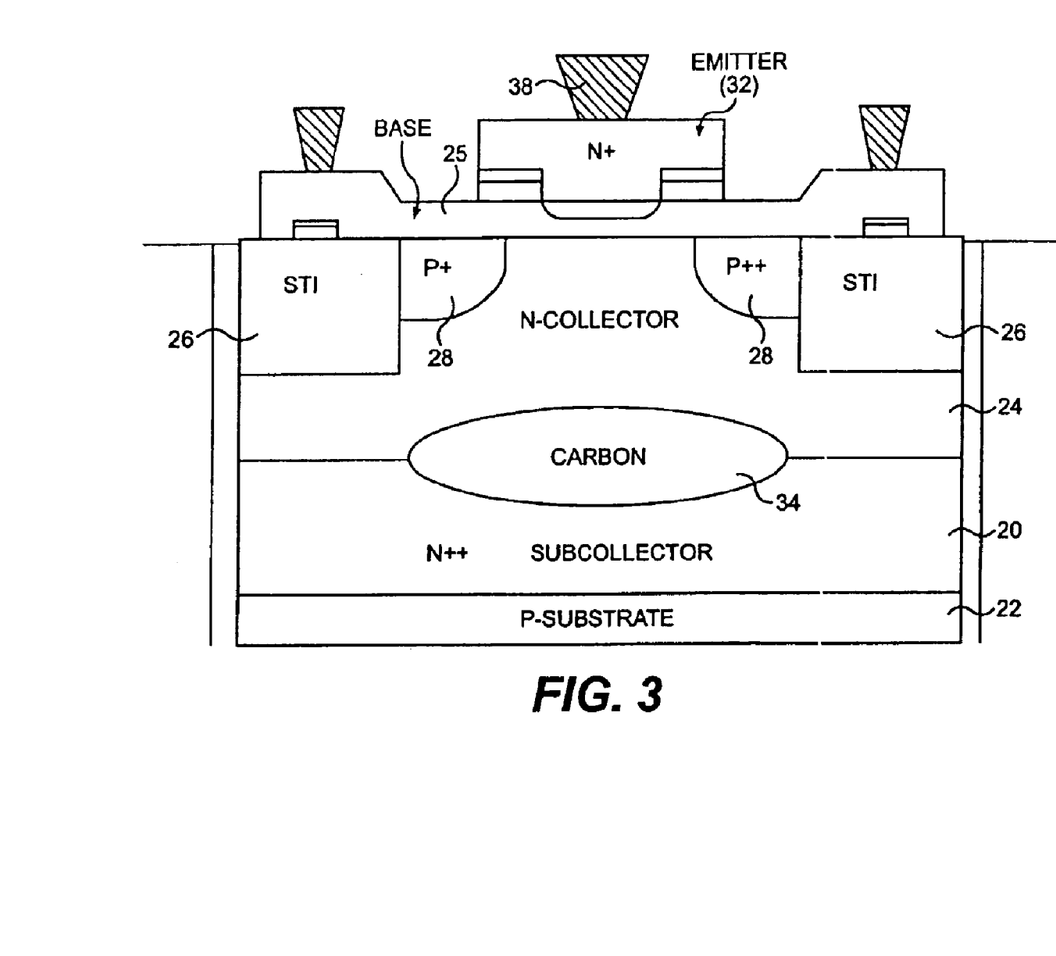
FIG. 3 shows a transistor of another embodiment of the present invention, with carbon implanted in collector and the sub-collector of the transistor.

A carbon implant (34) is then placed in various regions of the transistor. This carbon implant (34) promotes the migration of the n-type dopants in the collector away from the region of the p+ (28) extrinsic base and n− collector junctions. The carbon implant (34) can be placed above the n++ subcollector (20), at varying distances from the base/collector junctions. In FIG. 1, the carbon implant (34) is implanted in the n− collector (24) at a distance further from the p+ extrinsic base (28) than is implanted the carbon implant (34) in FIG. 2. Additionally, FIG. 3 shows the carbon implant (34) can be placed such that the carbon is implanted in both the n− collector (24) and the n++ subcollector (20). The carbon implant can also be placed below the collector in the subcollector (Not Shown).

Figure 4:
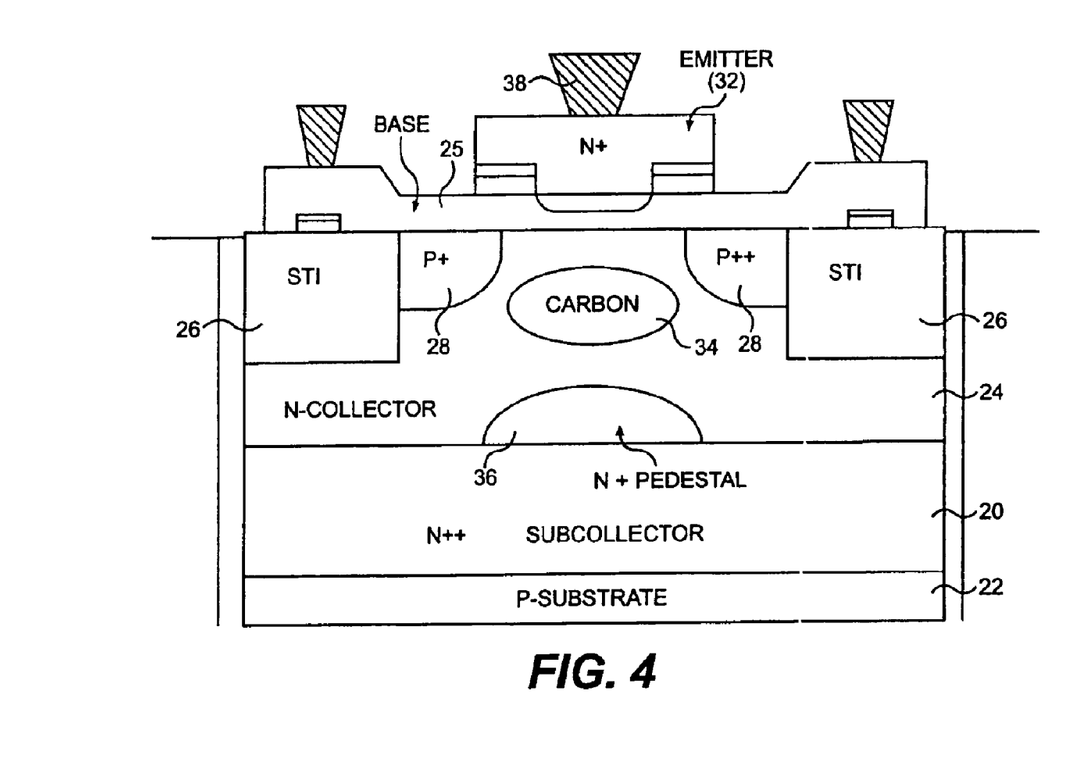
FIG. 4 shows a transistor of another embodiment of the present invention, with an N+ pedestal formed in the collector of the transistor, with the carbon implant in proximity to the extrinsic base.
Figure 5:
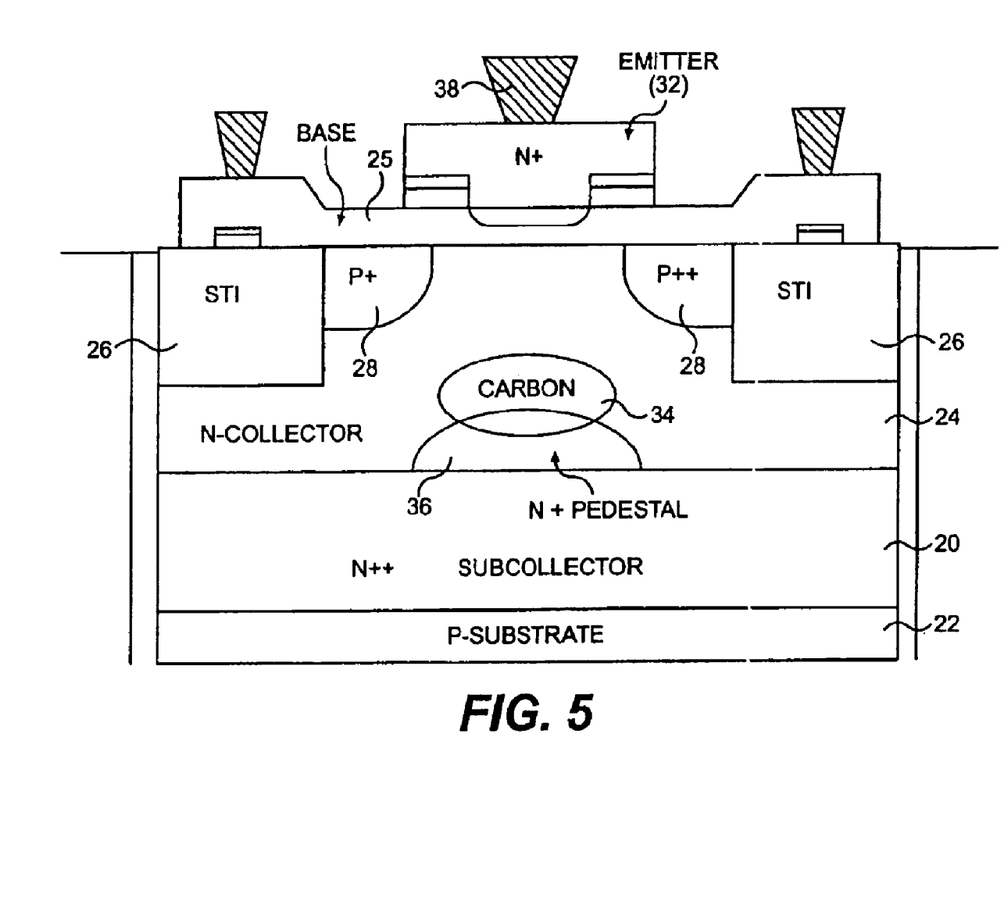
FIG. 5 shows a transistor of another embodiment of the present invention, with an N+ pedestal formed in the collector of the transistor, with a carbon implant in both the collector and the N+ pedestal.

As discussed above, the carbon implant (34) in the n− collector region (24) influences the diffusion of the n− dopants located in the n− collector in the vicinity of the base-collector junctions of the transistor. The carbon implant leads to a high current density which forces the space charge region of the base-collector junction to get pushed into the collector region. Such an effect tends to reduce the frequency response of the transistor, and thus raise $BV_{CEO}$. To reduce this effect, an n+ pedestal region (36) is implanted through the emitter window of the SiGe HBT. Implanting this n+ pedestal maintains a high $f_T$ deviceâ€" which in turn maintains a low $BV_{CEO}$.

The influence the carbon implant will have on $BV_{CEO}$ is a function of the distance between the carbon implant (34) and the base region. As the carbon implant is placed closer to the base region, the n− dopants in the n− collector (24), under the influence of the carbon atoms present in the carbon implant (34), diffuse away from the n− collector (24) p+ (28) extrinsic base junction. As this n− dopant diffusion rate increases, the breakdown voltage of the n+ emitter (32) to n− collector (24) is lowered. Thus, one can control the magnitude of the lowering of $BV_{CEO}$ that the carbon implant (34) effects by varying the proximity of the carbon implant (34) to the base-collector junction.

For configuration of the ESD protection circuit, electrical connections are established in this structure. The contact (38) on the N+ region is the emitter contact. The collector contact (not shown) is achieved outside of the isolation using a N+ sinker contact, a n+ reachthrough contact, an N-well implant, or other means known in the art.

Figure 6:
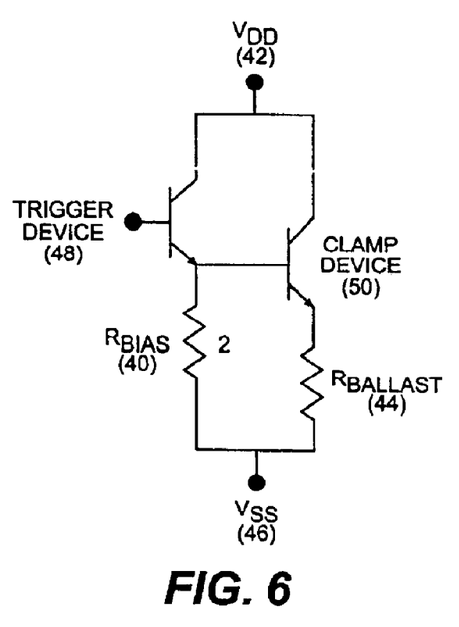
FIG. 6 shows a Darlington-configured trigger/clamp ESD protection circuit.

In FIG. 6, a transistor with a carbon implant is used as a trigger device (48) in an ESD protection circuit. The emitter of the trigger device (48) is connected to the bias resistor (40). The collector region of the trigger device (48) is connected to the VDD (42) power supply. FIG. 6 shows the base of the trigger device (48) as floating, but the base can be biased or connected to other circuit elements. The base of the clamp device (59) is connected to the emitter of the trigger device (48). The collector of the clamp device (50) connected to VDD (42). The emitter of the clamp device (50) is connected to either a ballast resistor (44) or $V_{SS}$ power supply (46).

FIG. 6 shows an example of Darlington configured bipolar ESD power clamp. For a power clamp, the clamp device (50) must have a high breakdown voltage in order to address the functional potential between the VDD power supply and ground potential. This power clamp requires a $f_T$ above the ESD pulse frequency to discharge the current effectively. For the trigger device (48), a low breakdown voltage device is needed in order to initiate base current into the clamp device at an early enough voltage.

The SiGe HBT ESD Power Clamp network trigger network consists of a high $f_T$ SiGe HBT with a bias resistor. When the transistor collector-to-emitter voltage is below the breakdown voltage, no current is flowing through the trigger transistor. The bias resistor holds the base of the SiGe HBT clamp transistor to a ground potential. With no current flowing, the output clamp can be visualized as a "grounded base" npn device between the power supplies. When the voltage on $V_{CC}$ exceeds the collector-to-emitter breakdown voltage, $BV_{CEO}$, in the high $f_T$, low $BV_{CEO}$ SiGe HBT, current flows into the base of the SiGe HBT high breakdown device. This leads to discharging of the current on the $V_{CC}$ electrode to the $V_{SS}$ ground electrode.

Table I shows Human Body Model (HBM) results from a Darlington configured SiGe transistor power clamp. A 47 GHz/4 V $BV_{CEO}$ trigger device supplies the 27 GHz/6 V $BV_{CEO}$ clamp device. A 7 Î© ballast resistor was used for each leg of the clamp device. A 7 kÎ© bias resistor was used below the trigger device to limit the current. In this power clamp, the trigger device had an open base configuration allowing early breakdown of the trigger circuit.

Table I. HBM test results of two stage Darlington circuit with low breakdown trigger and high breakdown clamp device.

| Trigger | Clamp | Size ($\mu$m) | HBM (kV) |
| --- | --- | --- | --- |
| 47 GHz | 27 GHz | | |
| | | 53.9 | 1.7 |
| | | 108 | 3.1 |
| | | 216 | 5.3 |
| | | 532 | 8.5 |

In the measurements, a fixed emitter width was used where the emitter length was increased for the ESD power clamp scaling. The measurements show increasing HBM results with the emitter length.

Machine model (MM) ESD testing of the SiGe HBT power clamps demonstrated the ESD response of the Darlington clamp circuit to a shorter rise time and higher current. Table 2 shows the MM ESD results for the SiGe HBT with the high frequency/low breakdown trigger and high breakdown/low frequency clamp network with the base floating. For machine model (MM) testing, the SiGe HBT ESD power clamp performance was also acceptable achieving 1.2 kV MM results for a 532 Å$\mu$m emitter length (clamp length). Comparing the HBM and MM results, the SiGe HBT clamp demonstrates a HBM/MM ratio of 8.8 for the smaller clamps and 7.08 for the largest clamp structure tested. This is consistent with other ESD measurements in that typical comparison between HBM/MM ratio is between 5 and 10. In the case of the shorted emitter-base case, the response of the network with structure scaling was evident in some MM tests whereas in HBM testing, no scaling was observed.

Table II. MM test results of the two stage Darlington circuit with low breakdown trigger and high breakdown clamp device (base trigger floating).

| Trigger | Clamp | Size ($\mu$m) | MM (kV) |
|---------|-------|---------------|---------|
| 47      | 27 GHz |              |         |
|         |       | 53.9          | 0.2     |
|         |       | 108           | 0.35    |
|         |       | 216           | 0.60    |
|         |       | 532           | 1.20    |

It is evident that the high frequency SiGe HBT trigger is responsive to both HBM and MM pulse widths enabling these Darlington power clamps for RF applications. As the Carbon dose is increased, the trigger voltage is reduced.

Figure 7:
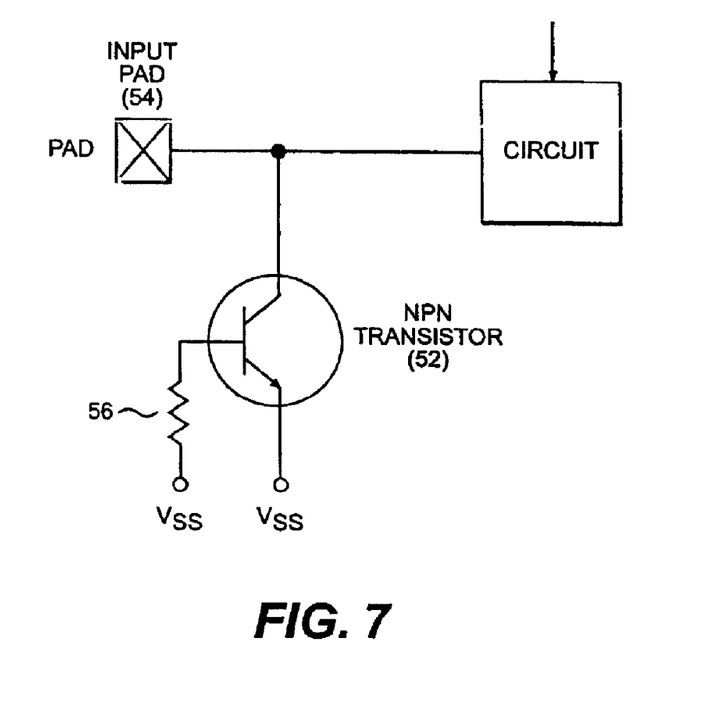
FIG. 7 shows another embodiment of an ESD protection circuit.

In FIG. 7, another ESD protection network is shown. The Carbon-modulated breakdown SiGe transistor (52) is defined such that its emitter is connected to ground and its collector is connected to the input pad (54). The base of the transistor is connected to a resistor (56) which is connected to the ground. The embodiment allows for a low voltage trigger breakdown voltage compared to the circuit. This provides ESD protection to the circuit by having a trigger voltage below the breakdown voltages of the circuit elements which need ESD protection. It is understood that this embodiments can be modified by providing additional transistors in series.

The foregoing description encompasses only the preferred embodiment of the present invention. The following claims and their equivalents define the scope of the invention.

What is claimed is:

1. In a transistor, comprising:

a base;

an emitter;

a subcollector;

a collector, doped with an n-type dopant; and a carbon implant residing in the collector and subcollector;

wherein:

the carbon is implanted at a location in the collector that modulates a redistribution of the n-type dopant in a region proximate to the base-collector region of the transistor, thereby lowering a collector-to-emitter breakdown voltage of the transistor.

* * * * *